(12) United States Patent
Aromin et al.

(10) Patent No.: US 12,184,056 B2
(45) Date of Patent: Dec. 31, 2024

(54) POWER CORD LCDI AND HOTSPOT DETECTOR CIRCUIT

(71) Applicants: Tower Manufacturing Corp., Providence, RI (US); David P. DiSanto, Greenville, RI (US)

(72) Inventors: Victor V Aromin, West Warwick, RI (US); Louis J Shatkin, Warwick, RI (US)

( * ) Notice: Subject to any disclaimer, the term of this patent is extended or adjusted under 35 U.S.C. 154(b) by 0 days.

(21) Appl. No.: 18/624,240

(22) Filed: Apr. 2, 2024

(65) Prior Publication Data

US 2024/0275157 A1  Aug. 15, 2024

Related U.S. Application Data

(63) Continuation-in-part of application No. 18/168,341, filed on Feb. 13, 2023, now Pat. No. 11,979,016.

(51) Int. Cl.
| | |
|---|---|
| *H02H 1/00* | (2006.01) |
| *G01R 31/52* | (2020.01) |
| *G01R 31/58* | (2020.01) |
| *H02H 3/253* | (2006.01) |

(52) U.S. Cl.
CPC ............ *H02H 1/003* (2013.01); *G01R 31/52* (2020.01); *G01R 31/58* (2020.01); *H02H 3/253* (2013.01)

(58) Field of Classification Search
CPC ...... G01R 31/086; G01R 31/52; G01R 31/54; G01R 31/58; H01B 13/22; H01B 7/228; H01B 7/32; H01B 9/003; H01B 9/02; H01H 83/02; H02H 1/0007; H02H 1/003; H02H 3/16; H02H 3/162; H02H 3/253; H02H 3/33; H02H 5/10
See application file for complete search history.

(56) References Cited

U.S. PATENT DOCUMENTS

| | | | | |
|---|---|---|---|---|
| 11,037,707 | B2* | 6/2021 | Aromin | H01B 9/02 |
| 2004/0070899 | A1* | 4/2004 | Gershen | H02H 3/331 |
| | | | | 361/42 |
| 2015/0214719 | A1* | 7/2015 | Aromin | H01R 13/7135 |
| | | | | 361/42 |
| 2018/0076283 | A1* | 3/2018 | Benna | H01L 29/7315 |
| 2020/0393520 | A1* | 12/2020 | Li | G01R 31/58 |
| 2021/0125746 | A1* | 4/2021 | Aromin | H01B 1/026 |
| 2021/0125753 | A1* | 4/2021 | Aromin | H01B 13/22 |
| 2021/0125754 | A1* | 4/2021 | Aromin | H02H 3/16 |

* cited by examiner

*Primary Examiner* — Jared Fureman
*Assistant Examiner* — Nicolas Bellido

(57) ABSTRACT

A LCDI power cord circuit is provided. The circuit includes energizing shielded wires and monitoring the energized shields for surges, e.g., arcing, and/or voltage drops, e.g., shield breaks detected by a Power Cord Fault Circuit (PCFC). In addition to shield breaks the PCFC also monitors the energized shields for shield degradation due to, for example, galvanic corrosion.

11 Claims, 11 Drawing Sheets

POWER CORD LCDI AND HOTSPOT DETECTOR CIRCUIT

CROSS-REFERENCE TO RELATED APPLICATIONS

The present continuation-in-part application is related to, claims the earliest available effective filing date(s) from (e.g., claims earliest available priority dates for other than provisional patent applications; claims benefits under 35 USC § 119 (e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith: U.S. patent application Ser. No. 18/168,341 entitled "LCDI Power Cord Circuit", naming Victor V. Aromin as first inventor, filed 13 Feb. 2023.

1. FIELD OF USE

This invention relates to leakage current detection and interruption (LCDI) power cord circuits for detecting a leakage current and open or faulty detector shields in a power cord.

2. DESCRIPTION OF PRIOR ART (BACKGROUND)

With the wide use of household electrical appliances, such as air conditioners, washing machines, refrigerators, etc., more attention is being paid to the safety of using such appliances. An appliance typically has a power cord of one meter or longer.

Power cords age due to long-term use, or may become damaged when the appliance is moved, which may cause a high current leakage between the phase line and the neutral or ground lines in the power cord. In addition to personal safety concerns, leakage current may cause sparks, which may cause fire and property damage. Leakage current can be detected by monitoring a small test voltage or current on conductive metal sheaths surrounding a conductive jacket surrounding the insulated phase and neutral lines. The metal sheaths are conventionally made by weaving thin copper wires surrounding, typically, an aluminum conductive jacket.

The conductive metal sheaths can fail due to failure in structural integrity (e.g., open) or corrosion due to galvanic action between dissimilar metals (e.g., copper braid and aluminum jacket). Failure of the metal sheaths may let dangerous leakage current go undetected by an ordinary LCDI circuit. Conventional LCDI circuits that test the continuity of the metal sheaths only test if the metal sheath is conductive or open. However, not tested by conventional LCDI circuits is galvanic corrosion between the dissimilar metals that may result in hot spots in the power cord, indicative of pending failure of the conductive metal sheaths.

Also, prior art solutions often provide a circuit for detecting an open shield, i.e., failed structural integrity, and a separate circuit for detecting leakage current. However, multiple circuits require more parts, increased footprint, and longer production cycles. Therefore, a need exists for a single circuit for detecting leakage current, metal sheath structural integrity, and metal sheath corrosion that could interfere with leakage current detection.

BRIEF SUMMARY

The present invention provides a power cord circuit useful for appliances such as air conditioners, washing machines, refrigerators, etc.

In accordance with one embodiment of the present invention a Leakage Current Detection Interrupter (LCDI) circuit for interrupting AC power from an AC source connected to a load via an insulated neutral wire and an insulated line wire is provided. The LCDI circuit includes the insulated neutral wire surrounded by a neutral wire shield (NWS); the insulated line wire surrounded by a line wire shield (LWS) connected to the NWS. The LCDI circuit also includes a power cord fault circuit (PCFC) for monitoring the NWS and LWS integrity and leakage current. The PCFC includes a non-linear device (NLD) and a bi-stable latching device for interrupting the AC power from the AC source via a relay. The LCDI circuit also includes a power supply circuit for supplying a rectified voltage waveform to the PCFC and the LWS.

In another aspect, the present invention provides a Power Cord Shield Monitoring (PCSM) circuit for interrupting AC power from an AC source connected to a load via an insulated neutral wire surrounded by a neutral wire shield (NWS) and an insulated line wire surrounded by a line wire shield (LWS), wherein the NWS and LWS are connected via a shield connector. The PCSM circuit includes a non-linear NPN transistor connectable to the NWS. The non-linear NPN transistor includes a saturation mode; a cut-off mode; and an active mode. The PCSM also includes a base biasing circuit for biasing the base of the NPN transistor. The base biasing circuit includes one or more base biasing resistors, the NWS; the LWS; the shield connector; and at least one collector biasing resistor connectable to the collector and the bi-stable latching device. The NPN transistor, the base biasing circuit and the at least one collector biasing resistor determine the NPN transistor mode. Also included: a mechanically latched double pole switch disposed between the AC source and the load; a relay for delatching the double pole switch; and a bi-stable latching device connected to the NLD and the relay for interrupting the AC power from the AC source based on the NLD mode. At least one capacitor connectable to the NLD and the bi-stable latching device and a power supply circuit for biasing the NLD and the bi-stable latching device are also provided.

The invention is also directed towards a Power Cord Shield Monitoring (PCSM) circuit for interrupting AC power from an AC source connected to a load via an insulated neutral wire surrounded by a neutral wire shield (NWS) and an insulated line wire surrounded by a line wire shield (LWS), wherein the NWS and LWS are connected via a shield connector. The PCSM circuit includes a non-linear device (NLD) connectable to the NWS. The NLD may be any suitable NLD such as a transistor having a collector, an emitter, and a base. The NLD has several operation modes: a saturation mode where the NLD acts as a short circuit, a cut-off mode where the NLD acts like an open circuit, and an active mode where current through the NLD is proportional to the bias current on the NLD's control port such as the base of an NPN transistor configured as a common emitter as described herein. The PCSM circuit also includes a bi-stable latching device connected to the NLD for interrupting the AC power from the AC source based on the NLD operating mode.

Various other features and advantages will appear from the description to follow. In the description, reference is made to the drawings which form a part thereof, and in which is shown by way of illustration, specific embodiments for practicing the invention. These embodiments will be described in enough detail to enable those skilled in the art to practice the invention, and it is to be understood that other embodiments may be used and that structural changes may be made without departing from the scope of the invention. That means the following detailed description is, not to be taken in a limiting sense.

BRIEF DESCRIPTION OF THE DRAWINGS

The subject matter which is regarded as the invention is pointed out and distinctly claimed at the end of the specification. The foregoing and other objects, features, and advantages of the invention are apparent from the following detailed description taken in conjunction with the drawings in which:

DETAILED DESCRIPTION

The following brief definition of terms shall apply throughout the application:

The term "comprising" means including but not limited to, and should be interpreted in the way it is typically used in the patent context;

The phrases "in one embodiment," "according to one embodiment," generally mean that the particular feature, structure, or characteristic following the phrase may be included in at least one embodiment of the present invention, and may be included in more than one embodiment of the present invention (such phrases do not necessarily refer to the same embodiment);

If the specification describes something as "exemplary" or an "example," it should be understood that refers to a non-exclusive example; and If the specification states a component or feature "may," "can," "could," "should," "preferably," "possibly," "typically," "optionally," "for example," or "might" (or other such language) be included or have a characteristic, that particular component or feature is not required to be included or to have the characteristic.

Figure 1:
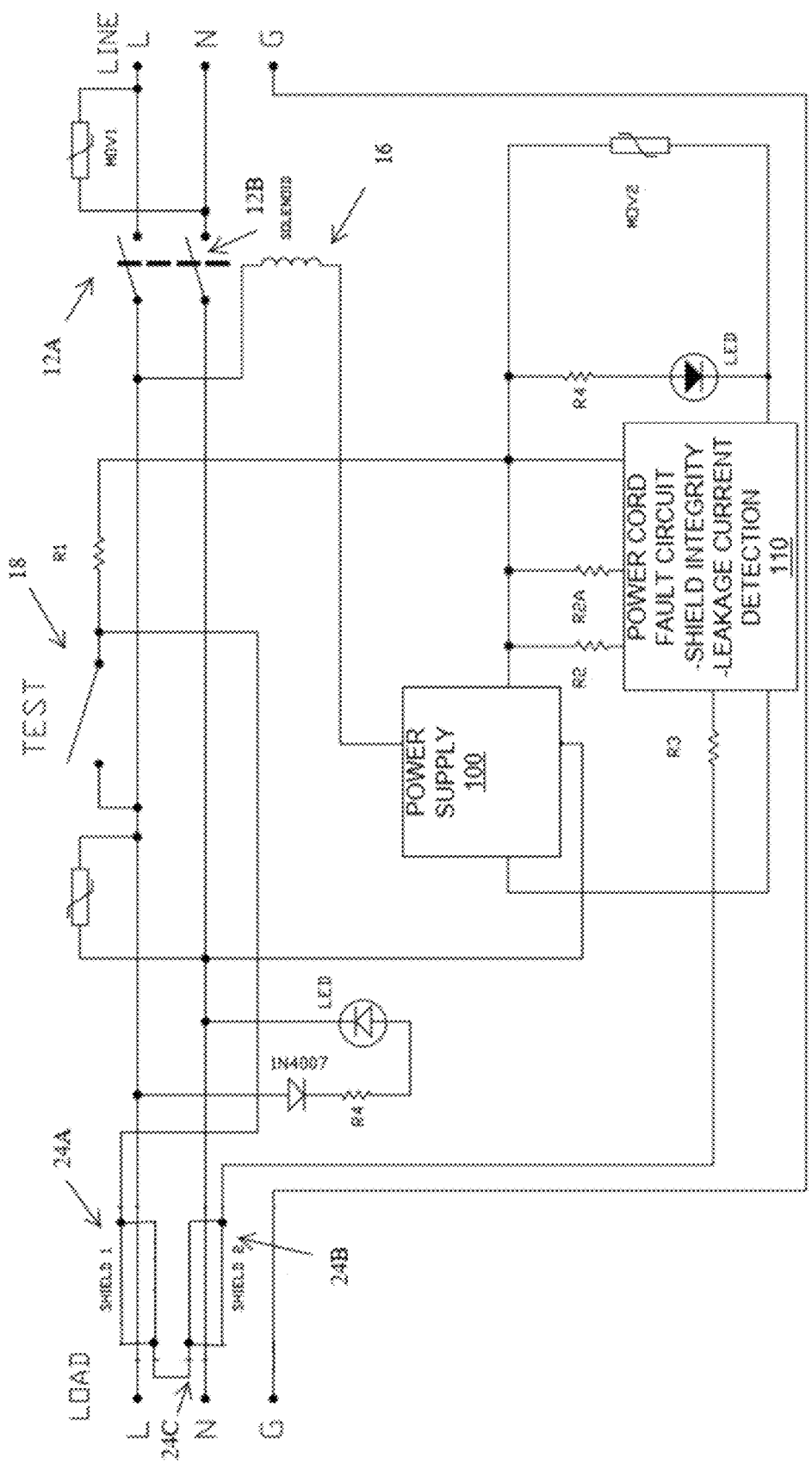
FIG. 1 is a circuit block diagram of the LCDI Power Cord Circuit in accordance with the present invention.

Referring to FIG. 1 there is shown a circuit block diagram of a LCDI POWER CORD CIRCUIT 10 (LCDI). LCDI circuit 10 includes Line Wire Shield (LWS) 24A and Neutral Wire Shield (NWS) 24B, TEST switch 18, power supply circuit 100, power cord fault circuit (PCFC) 110, relay 16; and, manually engaged ganged switches 12A, 12B, the manual reset switch. LCDI circuit 10 also includes R4 and LED for indicating normal operation. Also included are metal oxide varistors MOV1 and MOV2 for circuit overload protection.

When manual reset switches 12, 12A are set, line voltage is connected to LOAD and to power supply circuit 10 via relay 16. Power supply circuit 100 supplies bias voltages to PCFC 110, and shields 24A and 24B. Shields 24A and 24B are connected in series at the Load end. As discussed and shown in more detail herein, the PCFC 110 lets a small amount of relay current flow through relay 16 but less than the energizing current needed to energize relay 16 to disengage manual reset switches 12A,12B. It is appreciated that not starting from zero energizing current lets solenoid 16 energize faster when a fault is detected.

Figure 1A:
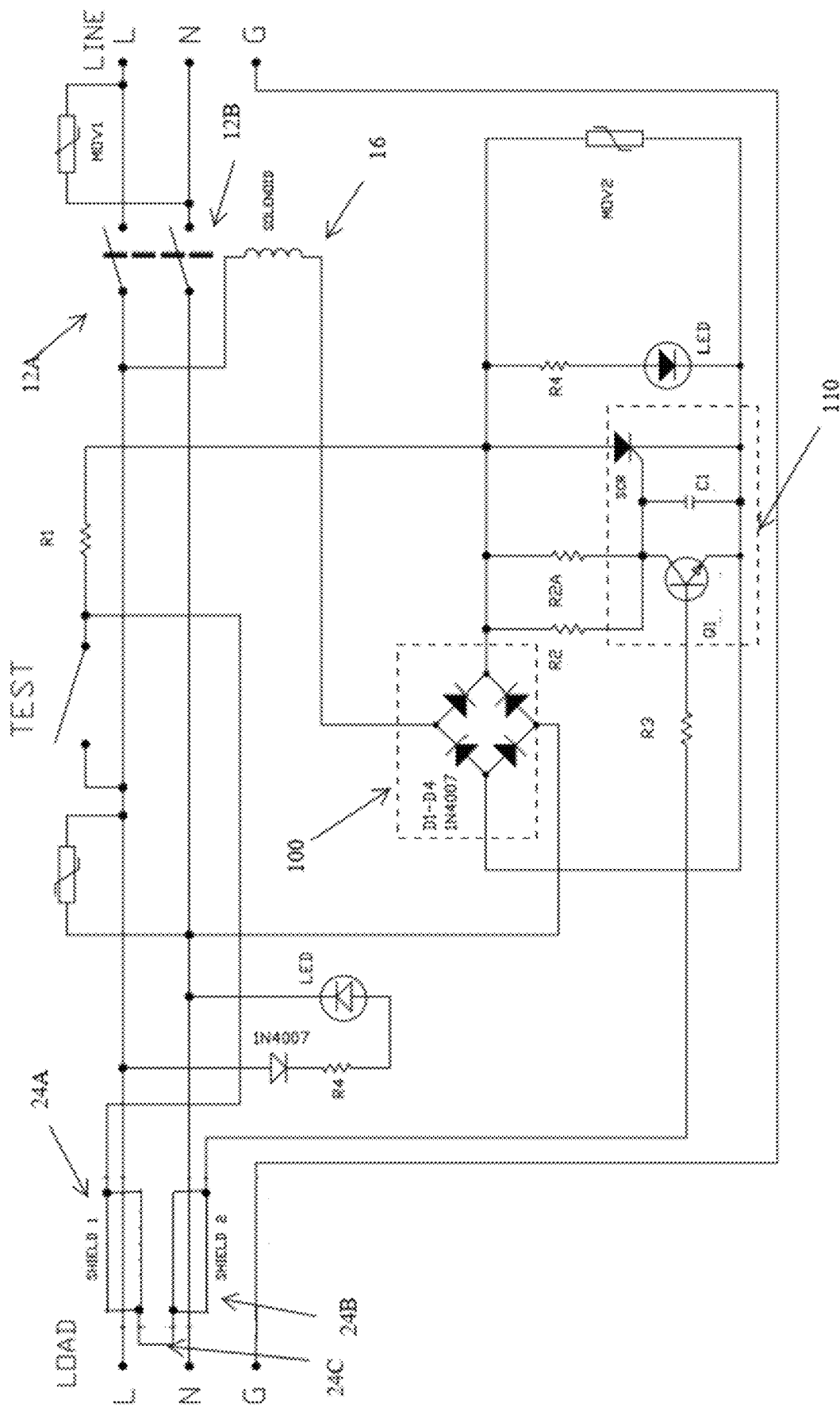
FIG. 1A is a detailed schematic diagram of the block diagram in FIG. 1.

Referring also to FIG. 1A there is shown a detailed circuit 10A of the block diagram 10 in FIG. 1. LCDI circuit 10A includes Line Wire Shield (LWS) 24A, Neutral Wire Shield (NWS) 24B, SHIELD CONNECTOR 24C, TEST switch 18, power supply circuit 100A, and PCFC 110A. PCFC 110A includes transistor Q1, capacitor C1, and silicon-controlled rectifier SCR. It will be understood that Q1 may be any suitable non-linear device having a saturation mode, a cut-off mode, and an active mode. SCR may be any suitable bi-stable latching device. Line Wire Shield (LWS) 24A and Neutral Wire Shield (NWS) 24B may be any suitable conductive shield surrounding the line and neutral wires as discussed in more detail herein. When manual reset switches 12, 12A are set line voltage is connected to LOAD and to power supply circuit 100A via relay 16. Power supply circuit 100A supplies bias voltages to PCFC 110A, and shields 24A and 24B. As discussed and shown in more detail herein, the PCFC 110 lets a small amount of relay current flow through relay 16 but less than the energizing current needed to energize relay 16 to disengage manual reset switches 12, 12A. It is appreciated that not starting from zero energizing current lets relay 16 energize faster when a fault is detected.

Figure 2:
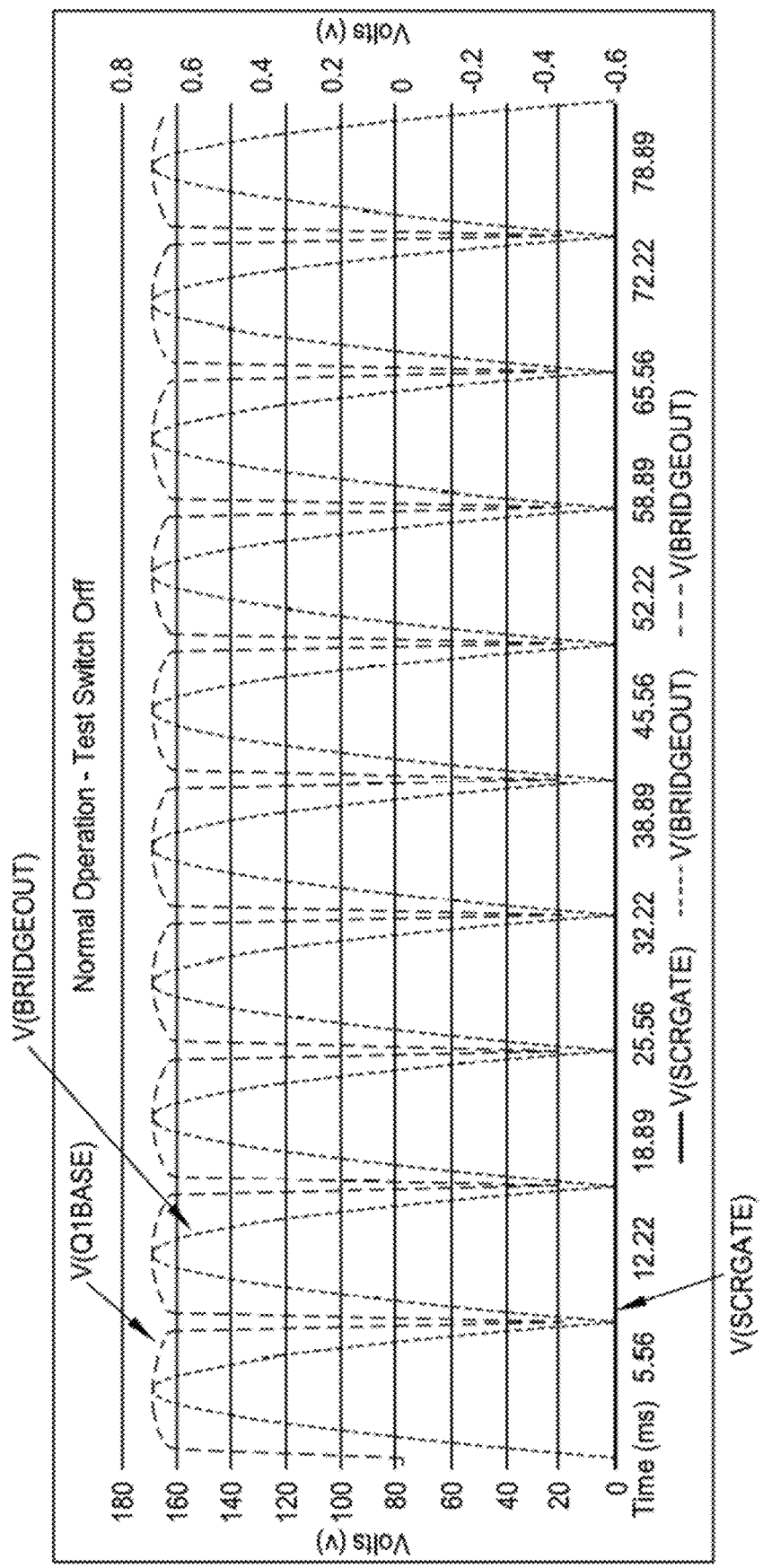
FIG. 2 is a waveform diagram for the normal operating condition of the Power Cord Circuit in FIGS. 1, 1A.
Figure 3:
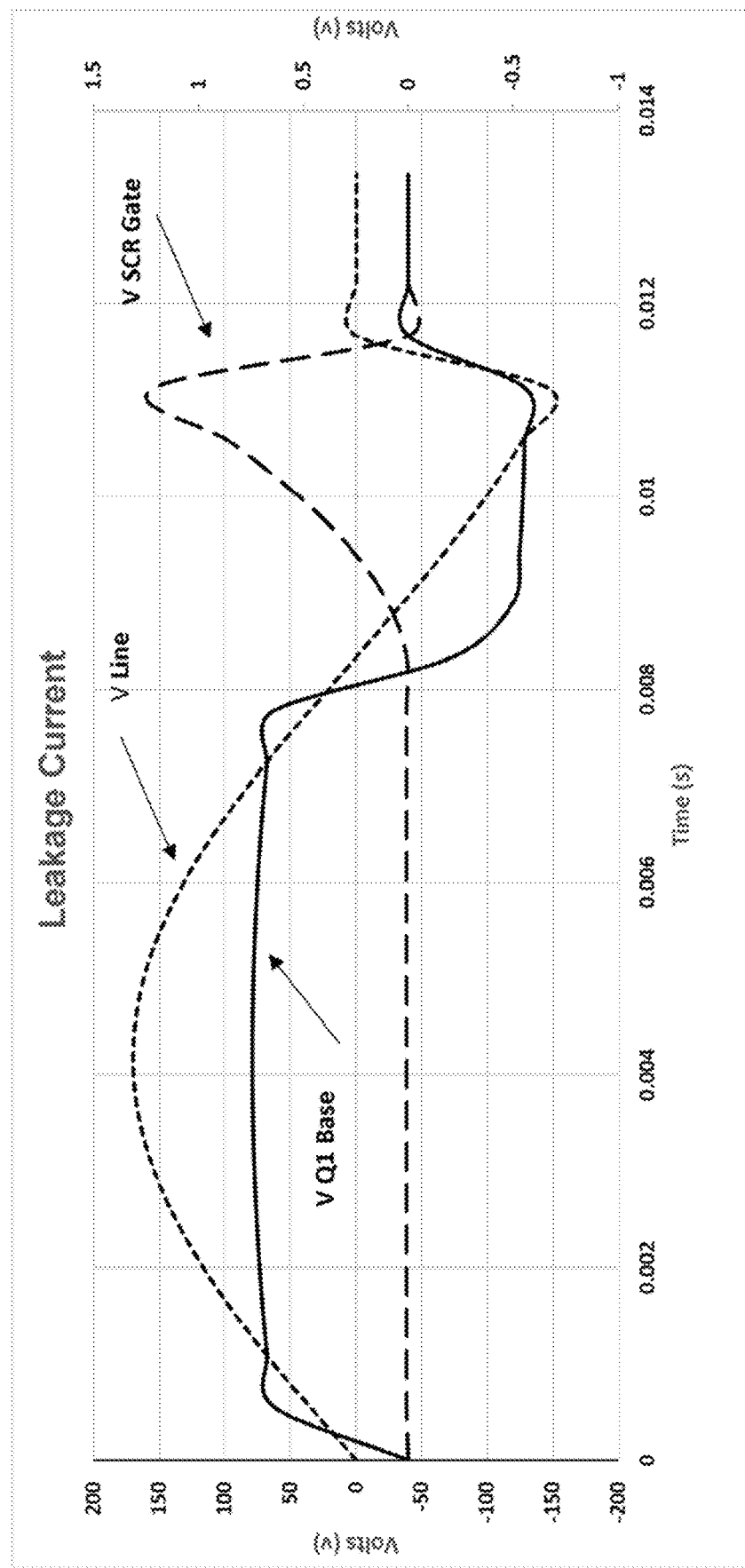
FIG. 3 is a waveform diagram for the leakage current detection condition of the Power Cord Circuit in FIGS. 1, 1A.

Referring now to FIG. 1A and FIG. 2. When switches 12, 12A are mechanically (manually) engaged AC line voltage is connect to LOAD. 60 Hz AC line voltage is also connected to power supply circuit 110A via manually engaged relay 16. Power supply circuit 110A, comprising bridge rectifier (diodes D1-D4) outputs a rectified unsmoothed DC signal at BRIDGEOUT. The rectified unsmoothed DC signal at BRIDGEOUT is routed through Q1 base via shields 24A, 24B and resistors R1 and R3. The rectified unsmoothed DC signal at BRIDGEOUT is also routed through R2 and R2A to Q1 collector and SCR1 gate.

Still referring to FIG. 1A and FIG. 2, the rectified unsmoothed DC signal at BRIDGEOUT is routed to the base of NPN transistor Q1, R1 and R3 biasing Q1 into an on condition during the positive cycle of the rectified unsmoothed DC, dropping the rectified voltage across R2 and R2A. When Q1(B) voltage drops below Q1's $V_{BE}$ saturation voltage Q1 turns off. The voltage at Q1(C) and SCR1 gate are near 0 v due to the unsmoothed DC signal at BRIDGEOUT dropping to near 0 v in the cycle. When the unsmoothed DC signal at BRIDGEOUT swings positive, Q1 is again biased on, dropping the unsmoothed DC signal at BRIDGEOUT across R2 and R2A, keeping SCR1 in an off condition during normal operation.

Still referring to FIG. 1A, it is understood that under normal conditions the rectified unsmoothed DC signal at BRIDGEOUT is dropped across resistor R2 and R2A and that R2 and R2A are sized to allow an amount of AC current less than the relay 16 energizing current to flow through R2 and R2A through Q1 back to neutral when Q1 is conducting. During Q1's off state, or non-conducting state, relay 16 inductively opposes the change in current until Q1 again turns on, thus maintaining, or nearly maintaining the current flow through relay 16. It is understood and appreciated that the small amount of relay current flowing through relay 16 is less than the energizing current needed to energize relay 16 to disengage manual reset switches 12,12A. It is further appreciated that not starting from zero energizing current lets relay 16 energize faster when a fault is detected.

Figure 4:
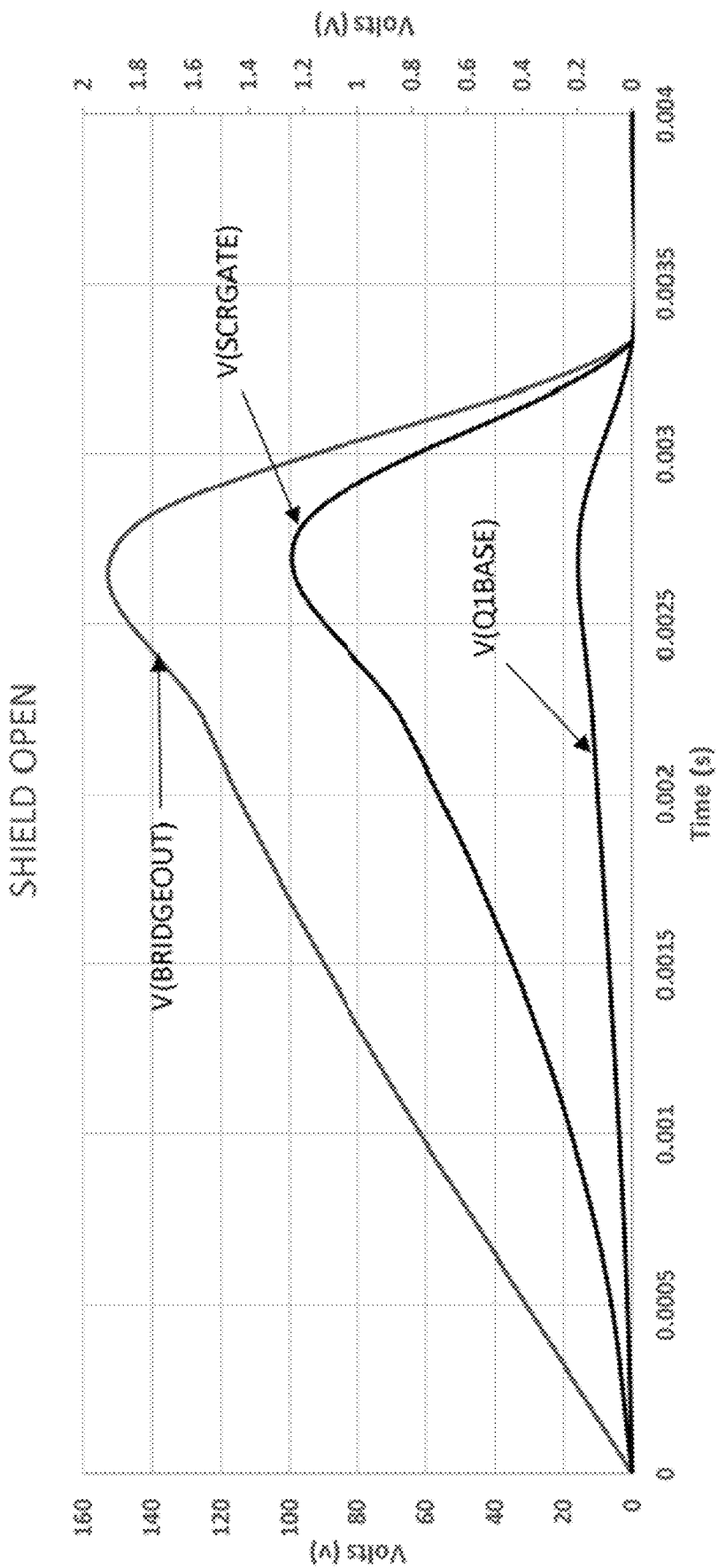
FIG. 4 is a waveform diagram for the shield open condition of the Power Cord Circuit in FIGS. 1, 1A.

Still referring to FIG. 1A and now FIG. 4, when either shield 24A or 24B integrity is compromised, e.g., open, the bias-on voltage $V_{BE}$ at the base of Q1 is not enough to keep Q1 in its full conductive state. The voltage at the Q1 collector (V(SCRGATE)) rises on the first positive rectified input cycle to trigger SCR1 into an on condition, sufficiently increasing current flow through relay 16 to energize relay 16 to disengage manual reset switches 12,12A. Thus, interrupting power from the AC line source to the load. It is understood and appreciated that the full wave bridge rectifier 100A enables the PCFC 110A to detect and disconnect the AC line source from the load when a fault is detected during the positive or negative cycle of an input AC waveform (not shown).

Figure 5:
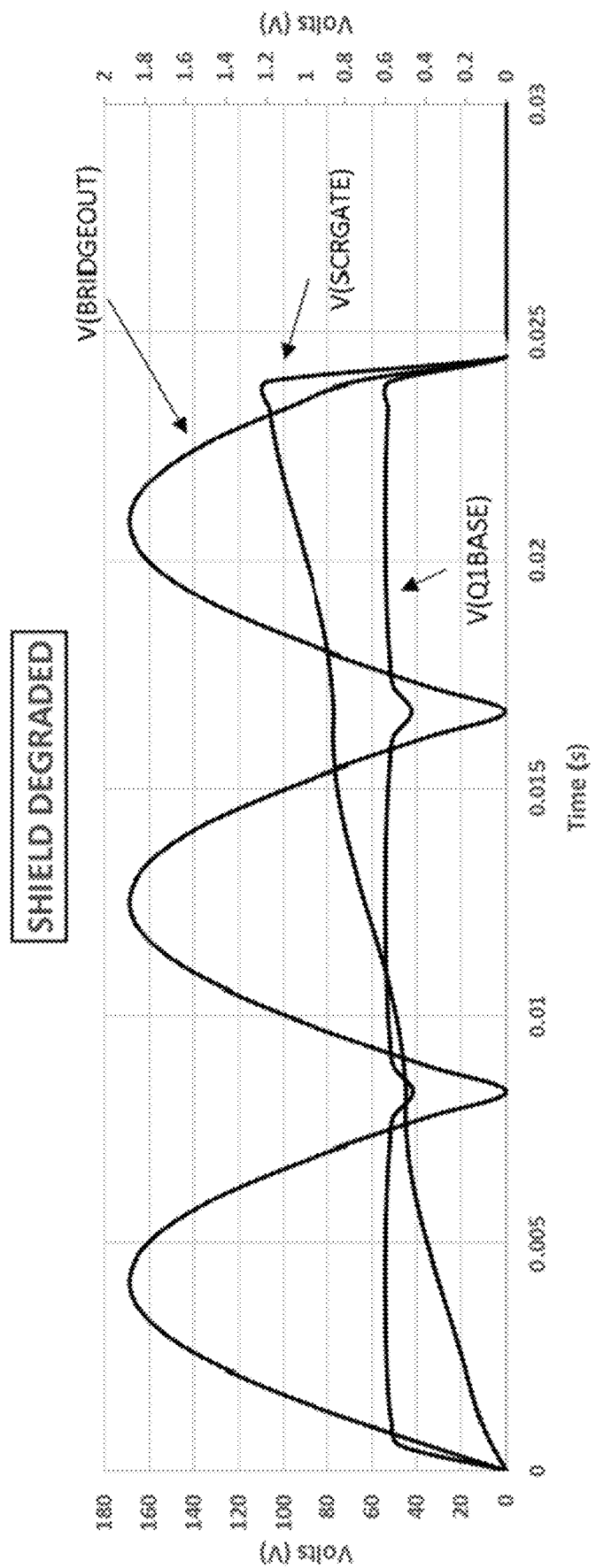
FIG. 5 is a waveform diagram for the shield degraded condition of the Power Cord Circuit in FIGS. 1, 1A.

Referring also to FIG. 5 there is shown a waveform diagram for the shield degraded condition of the Power Cord Circuit in FIGS. 1, 1A. It will be appreciated that R1, Shield 24A, Shield 24B, connector 24C and R3 form the base biasing circuit for Q1. As shield resistance goes up, e.g., due to galvanic corrosion due to dissimilar metals in the power cord shields, Q1 $V_{BE}$ will begin to fall below Q1's $V_{BE}$ saturation voltage thus decreasing ICE. As ICE decreases C1 begins to charge. When the charge on C1 reaches SCR1 gate trigger voltage, the SCR triggers into an on condition, which increases current flow through relay 16 to energize relay 16 to disengage manual reset switches 12,12A. Thus, interrupting power from the AC line source to the load.

Figure 6:
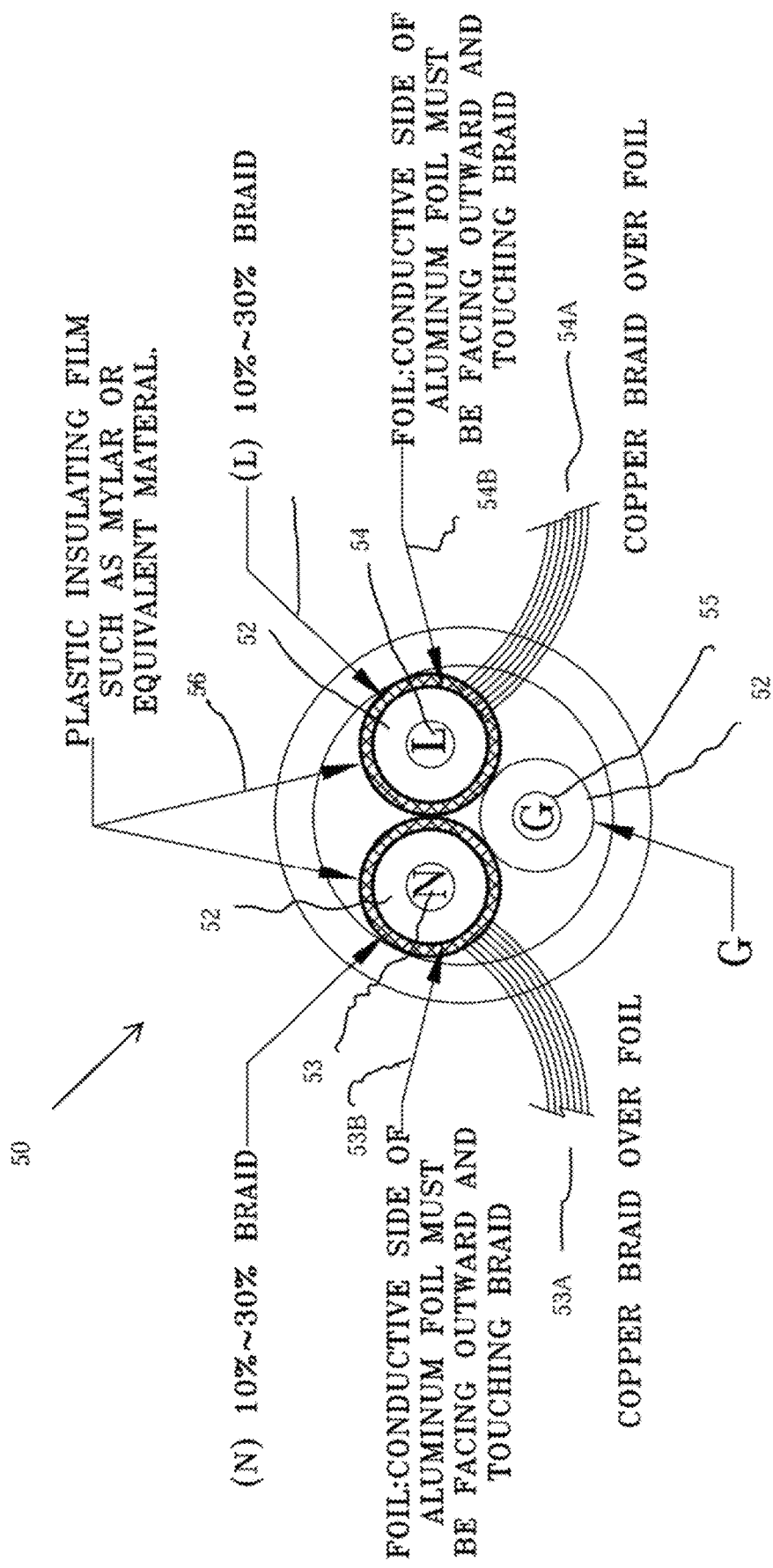
FIG. 6 is a diagram of the Line Wire Shield (LWS) and Neutral Wire Shield (NWS) shown in FIG. 1.

Referring also to FIG. 6 there is shown a diagram of Power Cord 50 including Line Wire Shield (LWS) 24A and Neutral Wire Shield (NWS) 24B shown in FIG. 1 and FIG. 1A. Power Cord 50 includes neutral wire 53, line wire 54, and ground wire 55. Neutral wire 53, line wire 54, and ground wire 55 are each surrounded by an insulator 52. The LWS 24A includes a conductive foil 54B, a conductive braid 54A surrounding the conductive foil 54B, and an electrical insulating film 56 surrounding the conductive foil 54B and the conductive braid 54A. The electrical insulating film 56 may be any suitable insulating film such as a polyester film made from stretched polyethylene terephthalate (PET). The NWS 24B includes a conductive foil 53B, a conductive braid 53A surrounding the conductive foil 53B and an electrical insulating film 56 surrounding the conductive foil 53B and the conductive braid 53A. The electrical insulating film 56 may be any suitable insulating film such as a polyester film made from stretched polyethylene terephthalate (PET).

Figure 7:
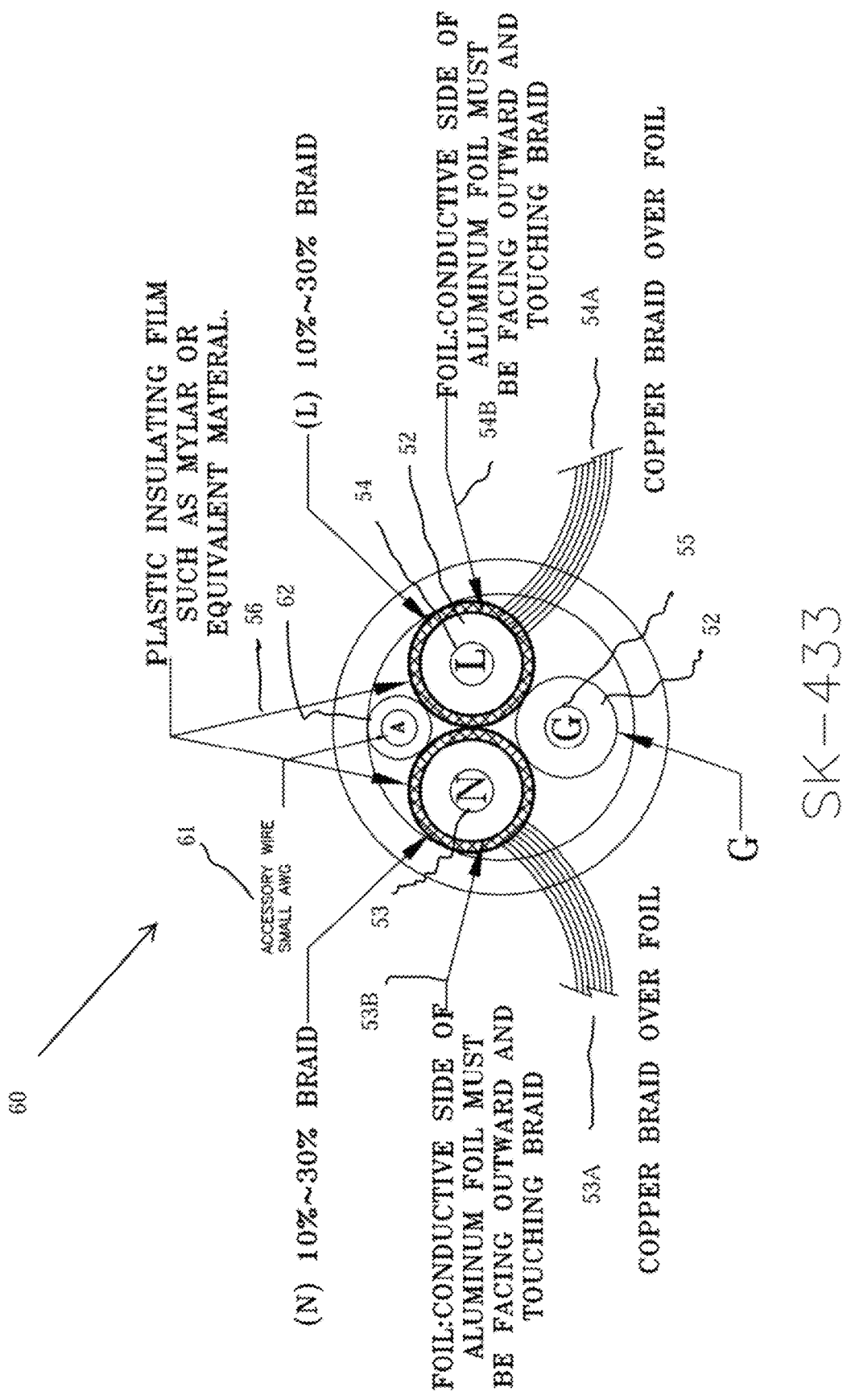
FIG. 7 is a diagram of an alternate embodiment of the Line Wire Shield (LWS) and Neutral Wire Shield (NWS) shown in FIG. 5.

Referring now to FIG. 7 there is shown an alternate embodiment 60 of the Power Cord 50 including Line Wire Shield (LWS) 24A and Neutral Wire Shield (NWS) 24B shown in FIG. 1A. Power Cord 60 includes neutral wire 53, line wire 54, and ground wire 55. Neutral wire 53, line wire 54, and ground wire 55 are each surrounded by an insulator 52. The LWS 24A includes a conductive foil 54B, a conductive braid 54A surrounding the conductive foil 54B, and an electrical insulating film 56 surrounding the conductive foil 54B and the conductive braid 54A. The electrical insulating film 56 may be any suitable insulating film such as a polyester film made from stretched polyethylene terephthalate (PET). The NWS 24B includes a conductive foil 53B, a conductive braid 53A surrounding the conductive foil 53B, and an electrical insulating film 56 surrounding the conductive foil 53B and the conductive braid 53A. The electrical insulating film 56 may be any suitable insulating film such as a polyester film made from stretched polyethylene terephthalate (PET). Power cord 60 also includes accessory wire 61 surrounded by insulation 62.

Figure 8:
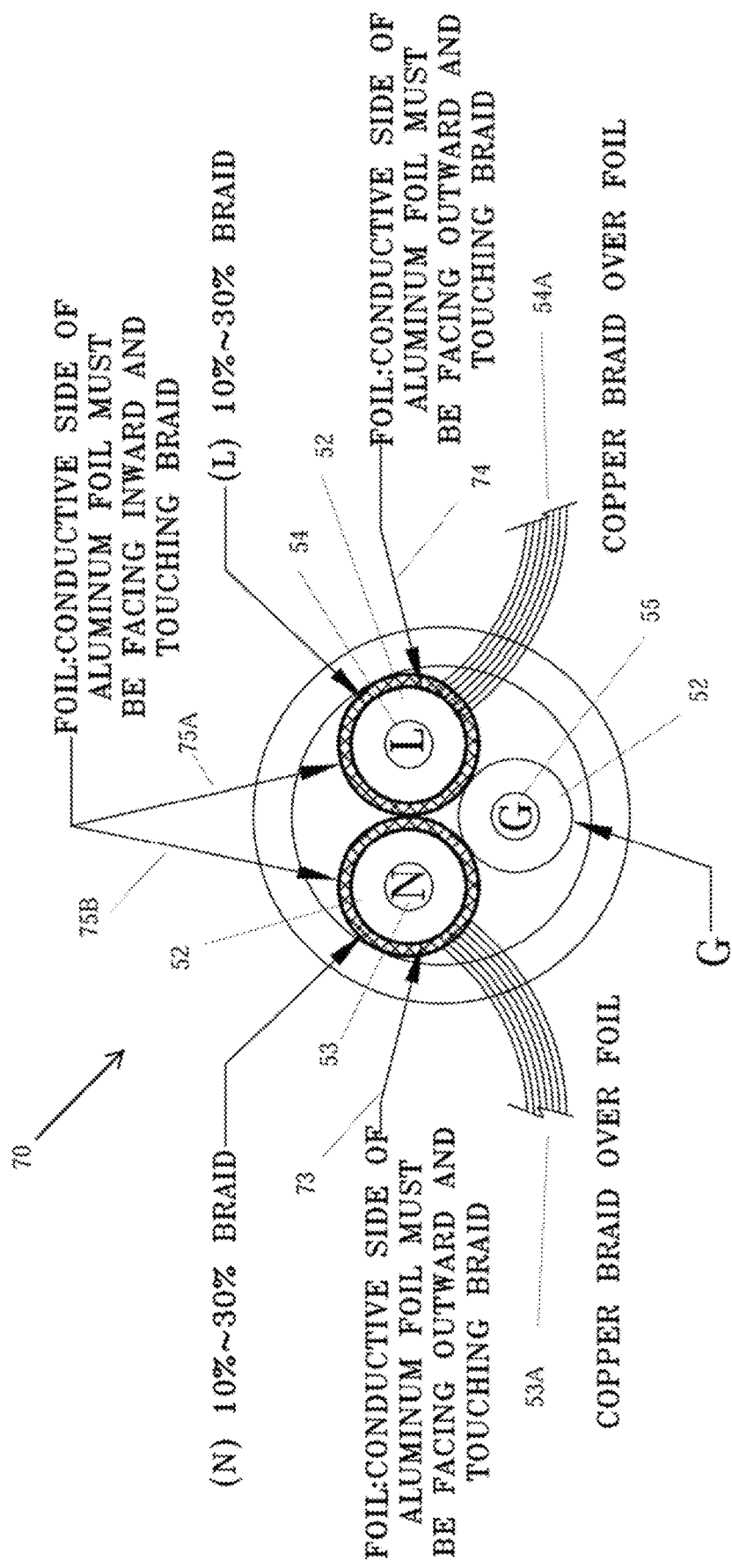
FIG. 8 is a diagram of an alternate embodiment of the Line Wire Shield (LWS) and Neutral Wire Shield (NWS) shown in FIG. 5.

Referring also to FIG. 8 there is shown an alternate embodiment 70 of the Power Cord 50 including Line Wire Shield (LWS) 24A and Neutral Wire Shield (NWS) 24B shown in FIG. 1A. Power Cord 70 includes neutral wire 53, line wire 54, and ground wire 55. Neutral wire 53, line wire 54, and ground wire 55 are each surrounded by an insulator 52. The LWS 24A includes wire 54, an insulator 52 surrounding wire 54, conductive foil 74, a conductive braid 54A sandwiched between the conductive foil 74 and insulator 52. The conductive foil 74 further includes a conductive side and a non-conductive side. The conductive side of conductive foil 74 faces outward and is in electrical contact with the conductive braid 54A. The NWS 24B includes wire 53, an insulator 52 surrounding wire 53, conductive foil 73, a conductive braid 53A sandwiched between the conductive foil 73 and insulator 52. The conductive foil 73 further includes a conductive side and a non-conductive side. The conductive side of conductive foil 73 faces outward and is in electrical contact with the conductive braid 53A. Each of the LWS and NWS are surrounded by a conductive foil 75. The conductive foil 75 further includes a conductive side and a non-conductive side. The conductive side of conductive foil 75A and 75B faces inward and is in electrical contact with the conductive braids 53A and 54A, respectively.

Figure 9:
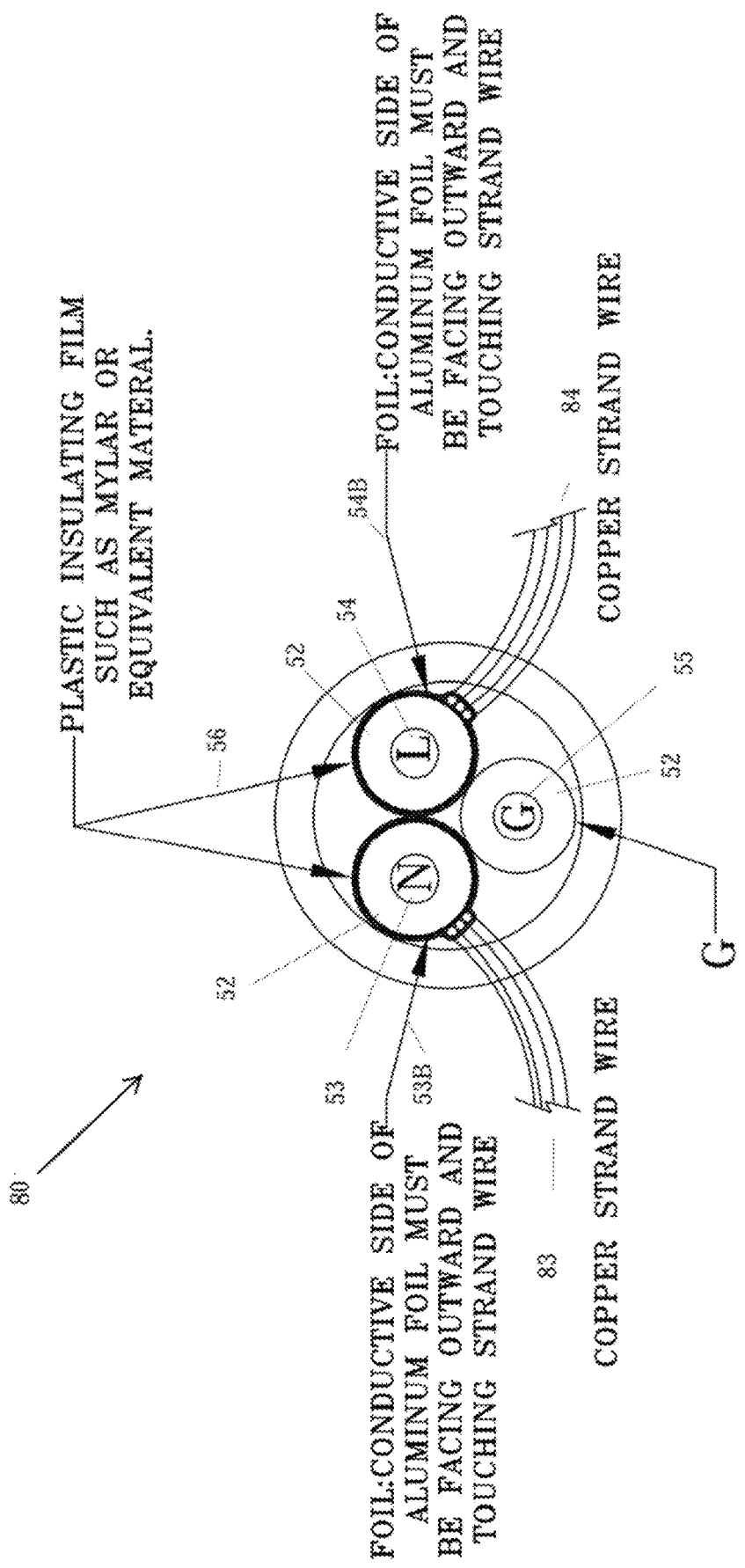
FIG. 9 is a diagram of an alternate embodiment of the Line Wire Shield (LWS) and Neutral Wire Shield (NWS) shown in FIG. 5.

Referring now to FIG. 9 there is shown an alternate embodiment 80 of the Power Cord 50 including Line Wire Shield (LWS) 24A and Neutral Wire Shield (NWS) 24B shown in FIG. 1A. Power Cord 80 includes neutral wire 53, line wire 54, and ground wire 55. Neutral wire 53, line wire 54, and ground wire 55 are each surrounded by an insulator 52. The LWS 24A includes a conductive foil 54B surrounding the insulated line wire 54, at least one copper strand wire 84 in electrical contact with the conductive foil 54B, and an electrical insulating film 56 surrounding the conductive foil 54B and the least one copper strand wire 84. The electrical insulating film 56 may be any suitable insulating film such as a polyester film made from stretched polyethylene terephthalate (PET). The NWS 24B includes a conductive foil 53B surrounding the insulated neutral wire 53, at least one copper strand wire 83 in electrical contact with the conductive foil 53B, and an electrical insulating film 56 surrounding the conductive foil 53B and the least one copper strand wire 83. The electrical insulating film 56 may be any suitable insulating film such as a polyester film made from stretched polyethylene terephthalate (PET).

Figure 10:
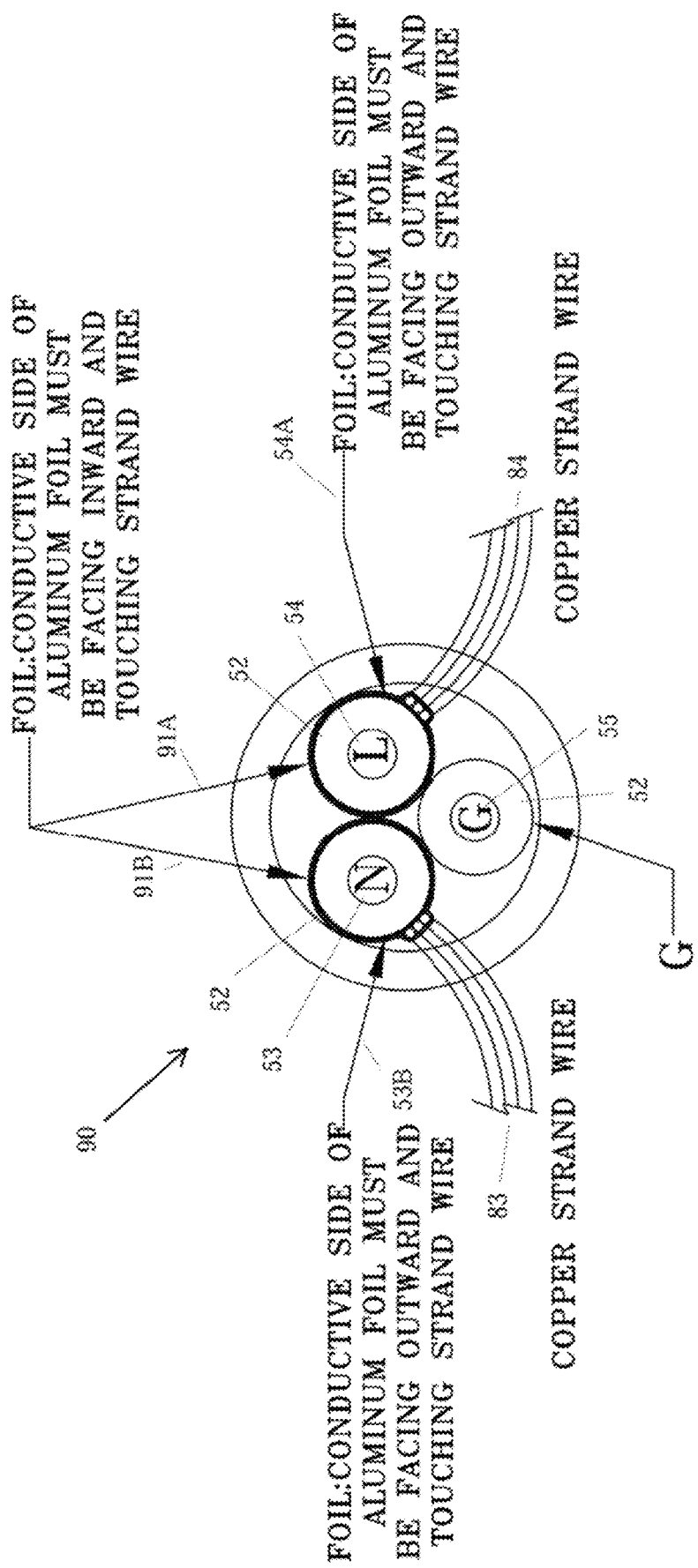
FIG. 10 is a diagram of an alternate embodiment of the Line Wire Shield (LWS) and Neutral Wire Shield (NWS) shown in FIG. 5.

Referring now to FIG. 10 there is shown an alternate embodiment 90 of the Power Cord 50 including Line Wire Shield (LWS) 24A and Neutral Wire Shield (NWS) 24B shown in FIG. 1A. Power Cord 90 includes neutral wire 53, line wire 54, and ground wire 55. Neutral wire 53, line wire 54, and ground wire 55 are each surrounded by an insulator 52. The LWS 24A includes a conductive foil 54B surrounding the insulated line wire 54, at least one copper strand wire 84 in electrical contact with the conductive foil 54B, and a conductive foil 91A surrounding the conductive foil 54B and the least one copper strand wire 84. Each of the conductive foils 54A and 91A include a conductive side and a non-conductive side. The at least one copper strand wire 84 is sandwiched between the conductive sides of conductive foils 54A and 91A. The NWS 24B includes a conductive foil 53B surrounding the insulated neutral wire 53, at least one copper strand wire 83 in electrical contact with the conductive foil 53B, and a conductive foil 91B surrounding the conductive foil 54B and the least one copper strand wire 83. Each of the conductive foils 53B and 91B include a conductive side and a non-conductive side. The at least one copper strand wire 83 is sandwiched between the conductive sides of conductive foils 3B and 91B.

It will be appreciated that the present invention detects degraded shields and open shields. Further, it should be understood that the foregoing descriptions are only illustrative of the invention. Thus, various alternatives and changes can be devised by those skilled in the art without departing from the invention. For example, solid state devices SCR1 or Q1 can be any suitable solid-state device. For example, Q1 may be any suitable non-linear device or transistor configuration, such as a common base configuration. The present invention is intended to embrace all such alternatives, changes and variances that fall within the scope of the appended claims.

What is claimed is:

1. A Leakage Current Detection Interrupter (LCDI) circuit for interrupting AC power from an AC source connected to a load via an insulated neutral wire and an insulated line wire, the LCDI circuit comprising:
   the insulated neutral wire surrounded by a neutral wire shield (NWS);
   the insulated line wire surrounded by a line wire shield (LWS), wherein the LWS is connectable to the NWS;
   a power cord fault circuit (PCFC) for monitoring NWS and LWS integrity and leakage current, wherein the PCFC comprises:
      a non-linear device (NLD) connectable to the NWS, wherein the NLD comprises:
         a NPN transistor having an emitter, a base a collector, and configured as a common emitter amplifier;
         at least one first base biasing resistor connectable to the NWS and the base;
         at least one second base biasing resistor connectable to the LWS and the power supply circuit; and
         at least one collector biasing resistor connectable to the collector and the power supply circuit;
   a bi-stable latching device for interrupting the AC power from the AC source; and
   a power supply circuit for supplying a first rectified voltage waveform to the PCFC and the LWS;
   the NPN transistor collector connected to the bi-stable latching device having on/off states, the NPN being selectively turned on and the bi-stable latching device turned off based on a first portion of a first rectified signal applied to the base of the NPN transistor;
   the NPN transistor selectively turned off and the bi-stable latching device turned on based on a first portion of the first rectified signal applied to the base of the NPN transistor and wherein the bi-stable latching device is selectively turned on within a first period; and
   a first capacitor connected to the NPN transistor collector and the at least one collector biasing resistor and wherein the NPN transistor, the first capacitor, the at least one collector biasing resistor the at least one base biasing resistor, and a degraded NWS or degraded LWS determine the first period.

2. The LCDI circuit as in claim 1 further comprising:
   the NPN transistor selectively turned off and the bi-stable latching device turned on based on a second portion of the first rectified signal applied to the base of the NPN transistor and wherein the bi-stable latching device is selectively turned on within a second period and wherein the first capacitor and the at least one collector biasing resistor determine the second period, and wherein the second period is less than the first period.

3. The LCDI circuit as in claim 2 further comprising:
   the NPN transistor selectively turned off and the bi-stable latching device turned on based on a negative voltage applied to the NPN transistor base.

4. A Power Cord Shield Monitoring (PCSM) circuit for interrupting AC power from an AC source connected to a load via an insulated neutral wire surrounded by a neutral wire shield (NWS) and an insulated line wire surrounded by a line wire shield (LWS), wherein the NWS and LWS are connected via a shield connector, the PCSM circuit comprising:
   a non-linear device (NLD) connectable to the NWS, wherein the NLD comprises:
      a saturation mode;
      a cut-off mode;
      an active mode; and wherein the NLD comprises:
         a NPN transistor having an emitter, a base and a collector;
         a base biasing circuit for biasing the base of the NPN transistor comprising:
            at least one resistor;
            the NWS;
            the LWS;
            the shield connector;
            at least one collector biasing resistor connectable to the collector and a bi-stable latching device, wherein the base biasing circuit and the at least one collector biasing resistor determine the NPN transistor mode;
            at least one capacitor connectable to the at least one collector biasing resistor and the bi-stable latching device; and
   the bi-stable latching device connected to the NLD for interrupting the AC power from the AC source based on the NLD mode.

5. The PCSM circuit as in claim 4 further comprising:
   the NPN transistor selectively turned on and the bi-stable latching device turned off when the NPN transistor is in the saturation mode.

6. The PCSM circuit as in claim 4 further comprising:
   the NPN transistor selectively turned off and the bi-stable latching device turned on within a first period when the NPN transistor is in the cut off mode, wherein the first period is determined by the at least one collector biasing resistor and the at least one capacitor.

7. The PCSM circuit as in claim 4 further comprising:
the NPN transistor selectively turned partially off and the bi-stable latching device turned on within a second period when the NPN transistor is in the active mode, wherein the second period is determined by the NPN transistor,
the base biasing circuit, the at least one collector biasing resistor and the at least one capacitor.

8. A Power Cord Shield Monitoring (PCSM) circuit for interrupting AC power from an AC source connected to a load via an insulated neutral wire surrounded by a neutral wire shield (NWS) and an insulated line wire surrounded by a line wire shield (LWS), wherein the NWS and LWS are connected via a shield connector, the PCSM circuit comprising:
a non-linear device (NLD) connectable to the NWS, wherein the NLD comprises:
a saturation mode;
a cut-off mode;
an active mode;
wherein the NLD comprises:
a NPN transistor having an emitter, a base, and a collector;
a base biasing circuit for biasing the base of the NPN transistor, the base biasing circuit comprising:
at least one base biasing resistor;
the NWS;
the LWS;
the shield connector;
at least one collector biasing resistor connectable to the collector and a bi-stable latching device, wherein the NPN transistor, the base biasing circuit and the at least one collector biasing resistor determine the NPN transistor mode;
a mechanically latched double pole switch disposed between the AC source and the load;
a relay for delatching the double pole switch;
the bi-stable latching device connected to the NLD and the relay for interrupting the AC power from the AC source based on the NLD mode;
at least one capacitor connectable to the NLD and the bi-stable latching device; and
a power supply circuit for biasing the NLD and the bi-stable latching device; and the NPN transistor selectively turned off and the bi-stable latching device turned on within a first period when the NPN transistor is in the cut off mode, wherein the first period is determined by the at least one collector biasing resistor and the at least one capacitor.

9. The PCSM circuit as in claim 8 wherein the power supply circuit comprises a full wave bridge rectifier.

10. The PCSM circuit as in claim 8 further comprising:
the NPN transistor selectively turned on and the bi-stable latching device turned off when the NPN transistor is in the saturation mode.

11. The PCSM circuit as in claim 8 further comprising:
the NPN transistor selectively turned partially off and the bi-stable latching device turned on within a second period when the NPN transistor is in the active mode, wherein the second period is determined by the NPN transistor,
the base biasing circuit, the at least one collector biasing resistor and the at least one capacitor.

* * * * *